(12) United States Patent
Kim et al.

(10) Patent No.: US 9,831,452 B2
(45) Date of Patent: Nov. 28, 2017

(54) METHOD FOR FORMING PN JUNCTION IN GRAPHENE WITH APPLICATION OF DNA AND PN JUNCTION STRUCTURE FORMED USING THE SAME

(71) Applicant: KOREA INSTITUTE OF SCIENCE AND TECHNOLOGY, Seoul (KR)

(72) Inventors: Chulki Kim, Samcheok-si (KR); Yeong Jun Kim, Seoul (KR); Young Mo Jung, Goyang-si (KR); Seong Chan Jun, Seoul (KR); Taikjin Lee, Seoul (KR); Seok Lee, Seoul (KR); Young Tae Byun, Guri-si (KR); Deok Ha Woo, Seoul (KR); Sun Ho Kim, Seoul (KR); Min Ah Seo, Seoul (KR); Jae Hun Kim, Seoul (KR); Jong Chang Yi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 131 days.

(21) Appl. No.: 14/282,026

(22) Filed: May 20, 2014

(65) Prior Publication Data

US 2015/0243917 A1 Aug. 27, 2015

(30) Foreign Application Priority Data

Feb. 24, 2014 (KR) ........................ 10-2014-0021412

(51) Int. Cl.
*H01L 51/05* (2006.01)
*H01L 51/00* (2006.01)
*H01L 51/10* (2006.01)
*C01B 31/04* (2006.01)

(52) U.S. Cl.
CPC ...... *H01L 51/0558* (2013.01); *C01B 31/0484* (2013.01); *H01L 51/002* (2013.01); *H01L 51/0012* (2013.01); *H01L 51/0045* (2013.01); *H01L 51/0093* (2013.01); *H01L 51/0562* (2013.01); *H01L 51/0583* (2013.01); *H01L 51/107* (2013.01)

(58) Field of Classification Search
None
See application file for complete search history.

(56) References Cited

U.S. PATENT DOCUMENTS 7,674,447 B2 3/2010 Watanabe et al.
7,678,357 B2 3/2010 Watanabe et al.
(Continued)

FOREIGN PATENT DOCUMENTS

CN 102983291 A * 3/2013

OTHER PUBLICATIONS

English Abgstract of publication of Korean Patent Application 1020140021412 by Kim.*
(Continued)

*Primary Examiner* — Hrayr A Sayadian
(74) *Attorney, Agent, or Firm* — NSIP Law

(57) ABSTRACT

A method for forming a PN junction in graphene includes: forming a graphene layer, and forming a DNA molecule layer on a partial region of the graphene layer, the DNA molecule layer having a nucleotide sequence structure designed to provide the graphene layer with a predetermined doping property upon adsorption on the graphene layer. The DNA molecule has a nucleotide sequence structure designed for doping of graphene so that doped graphene has a specific semiconductor property. The DNA molecule is coated on the surface of the graphene layer of which the partial region is exposed by micro patterning, and thereby, PN junctions of various structures may be formed by a region coated with the DNA molecule and a non-coated region in the graphene layer.

13 Claims, 6 Drawing Sheets

(56) References Cited

U.S. PATENT DOCUMENTS

| | | | | |
|---|---|---|---|---|
| 2007/0003958 A1* | 1/2007 | Okamoto | ............ | G01N 21/6452 |
| | | | | 435/6.12 |
| 2012/0286244 A1* | 11/2012 | Chiu | ................ | H01L 29/42364 |
| | | | | 257/40 |
| 2013/0214252 A1* | 8/2013 | Park | ...................... | B82Y 30/00 |
| | | | | 257/29 |
| 2014/0166959 A1* | 6/2014 | Bertin | ................ | G11C 13/0002 |
| | | | | 257/2 |

OTHER PUBLICATIONS

Wehling, T. O., et al. "Molecular doping of graphene." Nano letters vol. 8 No. 1 (2008):173-177.
Schwierz, Frank. "Graphene transistors." Nature nanotechnology vol. 5 (2010): 487-496.
Medina, Henry, et al. "Tuning of charge densities in graphene by molecule doping." Advanced Functional Materials 21. (2011):2687-2692.
Balandin, Alexander A. "Low-frequency 1/f noise in graphene devices." Nature Nanotechnology vol. 8. (2013):549-555.
Lohmann, Timm, Klaus von Klitzing, and Jurgen H. Smet. "Four-terminal magneto-transport in graphene pn junctions created by spatially selective doping." *Nano letters* 9.5 (2009): 1973-1979. (7 pages, in English).
Lin, Jian, et al. "Gating of Single-Layer Graphene with Single-Stranded Deoxyribonucleic Acids." *Small* 6.10 (2010): 1150-1155. (6 pages, in English).

\* cited by examiner

SEQUENCE LISTING

```
<160> NUMBER OF SEQ ID NOS: 4

<210> SEQ ID NO 1
<211> LENGTH: 21
<212> TYPE: DNA
<213> ORGANISM: Artificial Sequence
<220> FEATURE:
<223> OTHER INFORMATION: synthesized

<400> SEQUENCE: 1
gcggaggtgc acgcggagca c                                              21

<210> SEQ ID NO 2
<211> LENGTH: 21
<212> TYPE: DNA
<213> ORGANISM: Artificial Sequence
<220> FEATURE:
<223> OTHER INFORMATION: synthesized

<400> SEQUENCE: 2
gtgcgcgcac gcagacatat a                                              21

<210> SEQ ID NO 3
<211> LENGTH: 21
<212> TYPE: DNA
<213> ORGANISM: Artificial Sequence
```

```
<220> FEATURE:
<223> OTHER INFORMATION: synthesized

<400> SEQUENCE: 3
acatatatgt atgagtgcgc g                                              21

<210> SEQ ID NO 4
<211> LENGTH: 21
<212> TYPE: DNA
<213> ORGANISM: Artificial Sequence
<220> FEATURE:
<223> OTHER INFORMATION: synthesized

<400> SEQUENCE: 4
acatatagat gtacatatag a                                              21
```

METHOD FOR FORMING PN JUNCTION IN GRAPHENE WITH APPLICATION OF DNA AND PN JUNCTION STRUCTURE FORMED USING THE SAME

CROSS-REFERENCE TO RELATED APPLICATION

This application claims priority to Korean Patent Application No. 10-2014-0021412, filed on Feb. 24, 2014, and all the benefits accruing therefrom under 35 U.S.C. §119, the contents of which in its entirety are herein incorporated by reference.

BACKGROUND

1. Field

Embodiments relate to a method for forming a PN junction in graphene through the application of DNA and a PN junction structure formed thereby. More particularly, embodiments relate to formation of an organic material-based semiconductor junction structure by coating a nucleotide sequence-controllable DNA molecule on a graphene surface.

2. Description of the Related Art

A PN junction refers to a boundary or an interface between two regions exhibiting a p-type property and an n-type property inside a semiconductor. The PN junction is a key structure of many semiconductor devices because it can perform lots of important functions. In case an electric current flows in a forward direction, injection of minority carriers from each region to the opposite region occurs, and this is used in an emitter of a junction transistor or a light-emitting diode, a junction laser, and the like. When voltage is applied in a reverse direction, phenomena such as a minority carrier collection, electrostatic capacity characteristics of a depletion layer, and an electron avalanche multiplication in a depletion layer are produced. These phenomena are used in a collector and a condenser of a junction transistor, an avalanche photo diode, and the like.

Graphene is a material having a two-dimensional (2D) structure of carbon atoms arranged in a honeycomb lattice, and is made of a one atom-thick flat layer of carbon. Graphene is prone to build a 2D structure due to a specific atomic arrangement structure. Further, electrons behave like massless "Dirac" particles in graphene because electrons can penetrate into graphene at a high speed due to a very high charge mobility with a rest mass close to zero in the vicinity of carbon atoms. Thus, graphene has a high applicability as a sensor and a semiconductor circuit device, is advantageous in constructing a semiconductor device due to a small reduction in resistance caused by scattering, and provides advantages of process and manufacturing easiness.

However, contrary to silicon which is a semiconductor, graphene has no gap between a valence band and a conduction band. A band gap is an essential property for enabling a material used in manufacturing a transistor to allow turning on and off of an electric current. One method of introducing a band gap into graphene is to dope graphene, but in this instance, doping should be carefully performed without degrading the electrical properties inherent to graphene.

Typically, doping of graphene is performed through a chemical method. For localized doping, a diffusion process and an ion implantation process are usually applied. However, graphene doping by a diffusion process precludes localized doping in only a desired region, and thus, becomes an obstacle to integration of devices. Also, a graphene surface doping process by an ion implantation technique generates a lattice defect in graphene by ion collision, which reduces electron mobility of graphene. Further, these processes have disadvantages in that they require a high temperature process and high energy consumption to diffuse impurities by a concentration difference and to cause ions accelerated by the electric field to produce a lattice defect, need long time in a doping process, and have a probability of loss of electrical properties due to damage to an atomic arrangement structure of graphene during a process.

SUMMARY

Graphene is gaining much attention because of its excellent electrical and mechanical properties, but has unreliable semiconductor properties due to its lack of an energy band gap. According to an aspect, the present disclosure is directed to providing a technology for providing a chemical doping effect to a graphene surface using electrical properties of a DNA molecule according to its nucleotide sequence structure and forming a p-n junction in a channel portion of a circuit.

A method for forming a PN junction in graphene according to an embodiment may include forming a graphene layer, and forming a DNA molecule layer on a partial region of the graphene layer, the DNA molecule layer having a nucleotide sequence structure designed to provide the graphene layer with a predetermined doping property upon adsorption on the graphene layer.

A PN junction structure according to an embodiment may include a graphene layer, and a DNA molecule layer located on a partial region of the graphene layer and having a predetermined nucleotide sequence structure. Herein, the partial region of the graphene layer has a semiconductor property determined by the nucleotide sequence structure of the DNA molecule layer.

According to an aspect of the present disclosure, a chemical doping effect on graphene by adsorption of a DNA molecule onto the graphene surface may be controlled by adjusting a number of electrons in the DNA molecule through nucleotide sequence design of the DNA molecule. As a result, a period of time and process costs required for a doping process of the graphene may be reduced. Also, since a DNA molecule-graphene bond is formed through a simple adsorption process, the number of process steps is decreased and the process becomes less difficult, and thus, a device manufacturing yield may be increased. Further, because a DNA structure having a specifically designed nucleotide sequence can be produced using a commercial technology, graphene doping properties may be minutely controlled through DNA nucleotide sequence design.

A method for forming a PN junction in graphene and a PN junction structure according to an aspect may be advantageously used in various graphene-based active devices such as a flexible display, a flexible solar cell, a transparent display, a graphene-based ultra high speed transistor, and the like.

DETAILED DESCRIPTION

Figure 1:
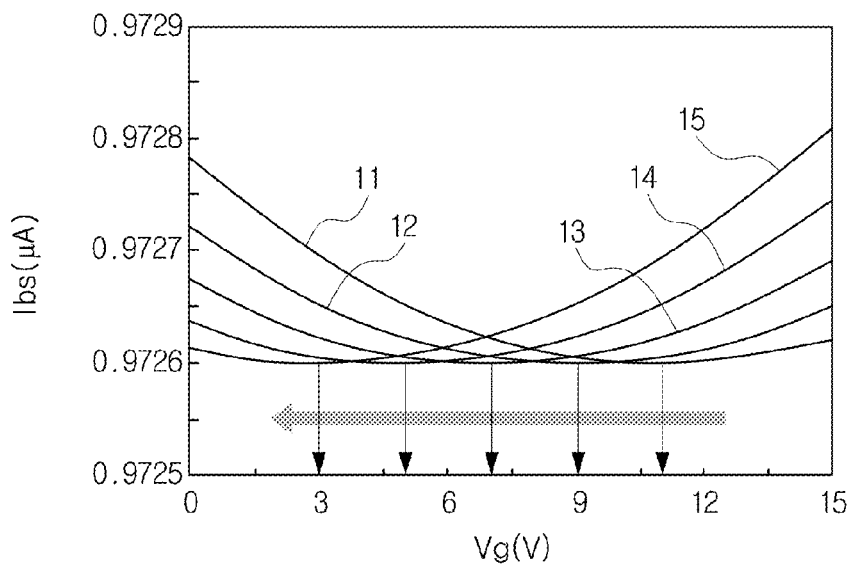
FIG. 1 is a graph showing an electric current-gate voltage change of graphene after four types of DNA molecules (SEQ ID NOs: 1-4) are adsorbed on graphene.

Hereinafter, embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, embodiments described in the specification and illustrations shown in the drawings are just examples of the present disclosure, and do not fully represent the technical aspects of the disclosure, so it should be understood that other equivalents and modifications could be made thereto.

The embodiments of the present disclosure are configured to provide a chemical doping effect to a surface of graphene using electrical properties of a DNA molecule according to its nucleotide sequence structure, and using this, to form a PN junction. The chemical doping effect by adsorption of the DNA molecule onto the graphene surface may be controlled by adjusting a number of electrons in the DNA molecule through nucleotide sequence design of the DNA molecule.

A DNA molecule has a structure in which each base forms a complementary pair. The DNA molecule has bases of adenine (A), thymine (T), cytosine (C), and/or guanine (G) and takes the form of a double helical structure by A-T and G-C pair structures. Basically, a DNA molecule is made of a spirally twisted structure. However, with the ability to build a single stranded DNA molecule and control its nucleotide sequence structure, it was made possible to artificially design an arrangement, a structure, and a length of a DNA molecule. A DNA molecule has a self-assembling property, and thus is prone to form a DNA structure. Further, the DNA molecule can induce junction with other material when a functional group is formed at a terminal of the DNA molecule. Certain materials may allow DNA molecule junction according to an orbital structure without activation using the functional group.

Graphene is a material having a two-dimensional (2D) atomic arrangement structure consisted of only carbon atoms. Graphene is prone to form a 2D structure by the atomic structure, and has excellent applicability as a sensor and a semiconductor circuit device due to a very high charge mobility with a rest mass close to zero in the vicinity of carbon atoms. Also, graphene provides advantages in that it is advantageous in constructing a semiconductor device due to a small reduction in resistance caused by scattering, provides process and manufacturing easiness, and allows simple and easy DNA molecule junction by π-π interaction of orbitals. When a molecule is adsorbed on graphene, a phenomenon is observed in which a Dirac point of graphene shifts by the adsorbed molecule. This is because the Fermi level of graphene changes as a carrier concentration of graphene changes by electron exchange between the adsorbed molecule and graphene.

Embodiments are configured to design a nucleotide sequence structure of a DNA molecule such that graphene is doped into a predetermined semiconductor property (p-type or n-type) when the DNA molecule is adsorbed on graphene, and to form a PN junction in graphene by selectively placing the designed DNA molecule on a surface of graphene. In the DNA molecule, A-T and G-C pairing has different amounts of charge based on binding characteristics of a protein structure, and this is because an A-T pair structure forms a double hydrogen bond structure while an G-C pair structure forms a triple hydrogen bond structure. Accordingly, an amount of charge that the DNA molecule possesses may be adjusted by adjusting a ratio of the selected bases (for example, guanine (G) and cytosine (C)). Using this principle, a chemical doping effect on graphene may be controlled by adjusting a number of electrons in the DNA molecule.

FIG. 1 is a graph showing an electric current-gate voltage change of graphene after four types of DNAs (SEQ ID NOs: 1-4) are adsorbed on graphene.

In FIG. 1, a horizontal axis denotes a gate voltage (Vg) of a transistor using graphene as a channel, and a vertical axis denotes a source-drain current (Ids) between a source electrode and a drain electrode through the channel or graphene. Also, in FIG. 1, a graph 15 represents a measurement result of graphene, and graphs 11 through 14 represent a measurement result of graphene on which DNA #1 though DNA #4 shown in the following Table 1 are adsorbed, respectively. In the DNA #1 though DNA #4 in Table 1, % in parenthesis denotes a ratio of guanine (G) and cytosine (C) among all bases of the DNA.

TABLE 1

| DNA #1 (SEQ ID NO: 1) | GCG GAG GTG CAC GCG GAG CAC (76%) |
|---|---|
| DNA #2 (SEQ ID NO: 2) | GTG CGC GCA CGC AGA CAT ATA (57%) |
| DNA #3 (SEQ ID NO: 3) | ACA TAT ATG TAT GAG TGC GCG (42%) |
| DNA #4 (SEQ ID NO: 4) | ACA TAT AGA TGT ACA TAT AGA (23%) |

As shown in FIG. 1, as the ratio of guanine (G) and cytosine (C) in DNA adsorbed on graphene becomes lower, a Dirac point of graphene defined as a gate voltage (Vg) at which a source-drain current (Ids) is minimum shifts to a lower gate voltage. That is, it is noted that an amount of carriers (holes) moving in graphene changes based on a nucleotide sequence structure of the adsorbed DNA. Using this reversely, electrical properties of graphene may be controlled using a nucleotide sequence structure of DNA adsorbed on graphene.

Figure 2:
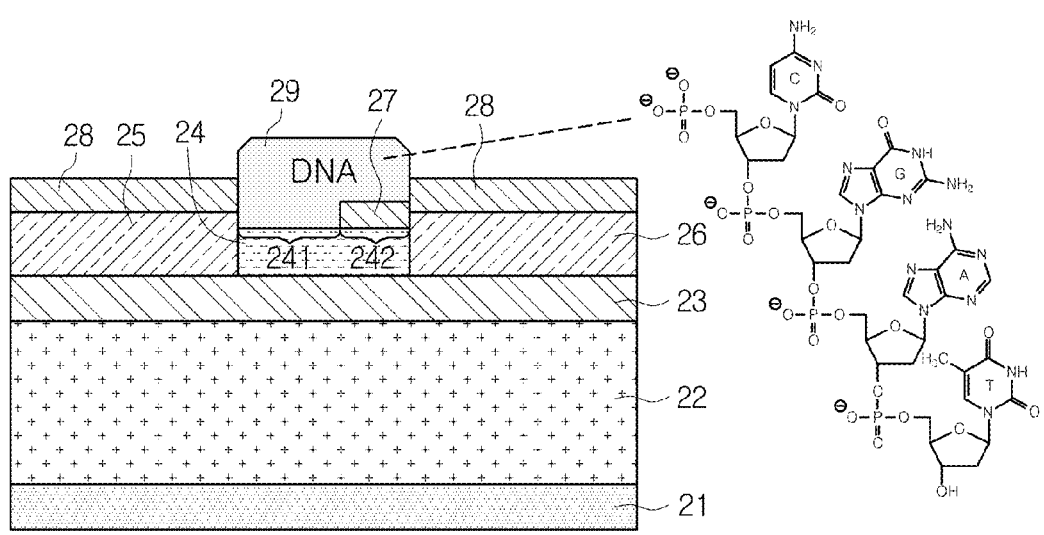
FIG. 2 is a schematic cross-sectional view illustrating a PN junction structure produced by coating a DNA molecule on a surface of a graphene layer according to an embodiment.

FIG. 2 is a schematic cross-sectional view illustrating a PN junction structure produced by coating a DNA molecule on a surface of a graphene layer according to an embodiment.

As used herein, a PN junction is intended to indicate any structure including at least one p-type semiconductor region and at least one n-type semiconductor region. Accordingly, a PN junction recited in the disclosure is intended to include a bipolar transistor such as a PNP junction or an NPN junction, as well as a PN junction formed of a p-type semiconductor and an n-type semiconductor or an NP junction formed of an n-type semiconductor and a p-type semiconductor. Further, a PIN junction or NIP junction further including an intrinsic silicon region disposed between a p-type semiconductor and an n-type semiconductor, or in contact with any one of a p-type semiconductor and an n-type semiconductor also falls within the scope of the PN junction described in the specification.

Referring to FIG. 2, the PN junction structure according to an embodiment may include a graphene layer 24 and a DNA molecule layer 29 located in part on the graphene layer 24. The DNA molecule layer 29 may be made up of DNA molecules adsorbed on the graphene layer 24 by a chemical process. The DNA molecule layer 29 may be located to only partially cover the graphene layer 24. For this placement of the DNA molecule layer 29, the PN junction structure may further include a passivation layer 27 interposed between a partial region 242 of the graphene layer 24 and the DNA molecule layer 29 to prevent the partial region 242 from coming into contact with the DNA molecule layer 29. The passivation layer 27 may be made of a photoresist.

A nucleotide sequence structure of the DNA molecules constituting the DNA molecule layer 29 may be determined based on a semiconductor property intended to be provided to the graphene layer 24. Basically, graphene has a p-type semiconductor property when forming a nanostructure (for example, nanoribbons). Herein, the DNA molecules of the DNA molecule layer 29 may be designed to provide an n-type semiconductor property by coating on a partial region of the graphene layer 24 where the DNA molecules come in contact with majority carriers in graphene. As a result, a region 242 not covered by the DNA molecule layer 29 among the graphene layer 24 has a p-type semiconductor property, the region 241 covered by the DNA molecule layer 29 has an n-type semiconductor property, and the two regions 241 and 242 may form a PN junction.

In the specification, the region 242 in non-contact with the DNA molecule layer 29 among the graphene layer 24 is referred to as a first region, and the region 241 in contact with the DNA molecule layer 29 among the graphene layer 24 is referred to as a second region.

In an embodiment, the graphene layer 24 of the PN junction structure may correspond to a channel layer of a transistor. That is, the PN junction structure may include a substrate 22, and a source electrode 25 and a drain electrode 26 located on the substrate 22, each disposed in contact with the graphene layer 24 at both sides of the graphene layer 24. The source electrode 25 and the drain electrode 26 may be made of a metal such as gold (Au) or other suitable conductive material.

In an embodiment, the PN junction structure may further include a first insulating film 21 and a second insulating film 23 each located at both surfaces of the substrate 22. The insulating film 23 may be located between the substrate 22 and the graphene layer 24. Each of the first insulating film 21 and the second insulating film 23 may be made of silicon oxide (SiOx) or other suitable insulation material.

Also, in an embodiment, the PN junction structure may further include a passivation layer 28 located on the source electrode 25 and the drain electrode 26. The passivation layer 28 may be made of a photoresist, similar to the passivation layer 27 on the graphene layer 24, and may be formed using one material in the same process with the passivation layer 27 as described below.

FIGS. 3a through 3e are schematic cross-sectional views illustrating a method for forming a PN junction in graphene using photolithography according to an embodiment.

Figure 3A:
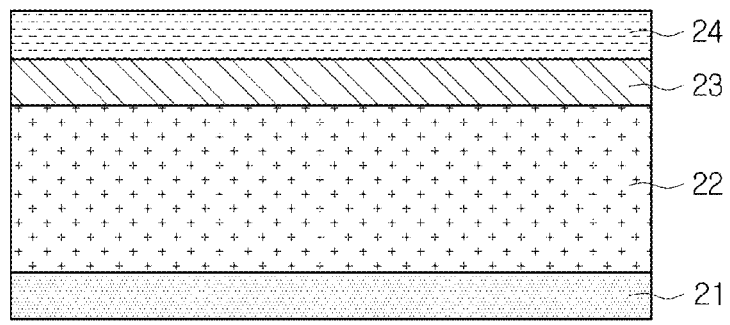
FIGS. 3a through 3e are schematic cross-sectional views illustrating a method for forming a PN junction in graphene using photolithography according to an embodiment.

The graphene-DNA based PN junction structure according to the embodiments may be formed using a semiconductor process. Referring to FIG. 3a, the first and second insulting films 21 and 23 may be each formed on both surfaces of the substrate 22, and the graphene layer 24 may be formed on one surface of the substrate 22 where the insulating films 21 and 23 are formed. In an embodiment, the graphene layer 24 may be formed on the substrate 22 by forming graphene on another substrate (not shown) and transferring it to the substrate 22. However, the process for forming the graphene layer 24 is not limited to above process.

Figure 3B:
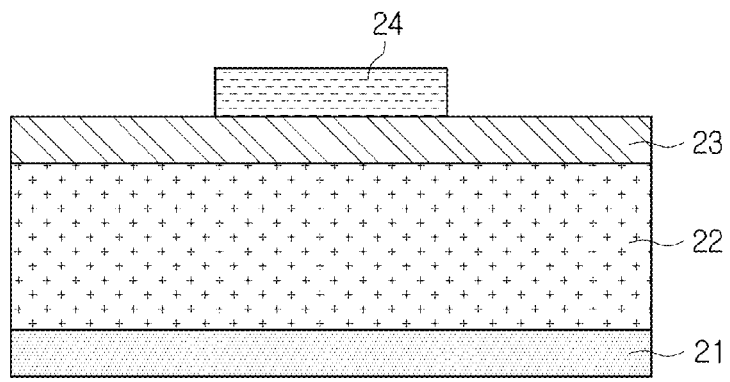

Referring to FIG. 3b, subsequently, the graphene layer 24 may be patterned using a mask formed through lithography. For example, the graphene layer 24 may be etched, leaving only a nanostructure portion that will function as a channel later to use the graphene layer 24 as a channel layer of a transistor.

Figure 3C:
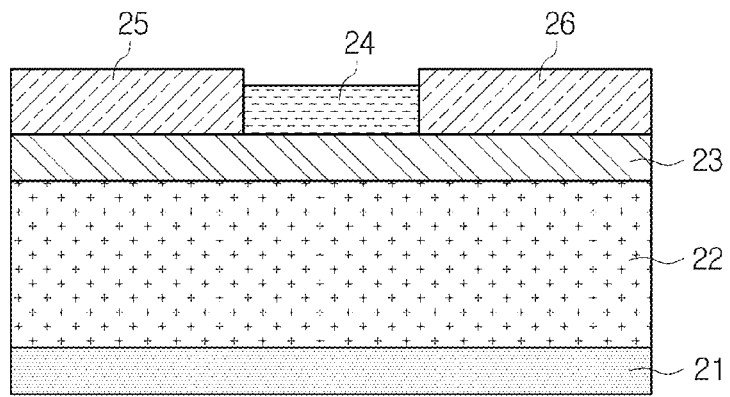

Referring to FIG. 3c, the source electrode 25 and the drain electrode 26 may be formed using lithography at both sides of the graphene layer 24 etched in a shape of a channel. The source electrode 25 and the drain electrode 26 may be formed by forming a layer of gold (Au) or other suitable conductive material on a top surface of the substrate 22, and patterning the layer of conductive material to leave only a portion that will be used as an electrode.

Figure 3D:
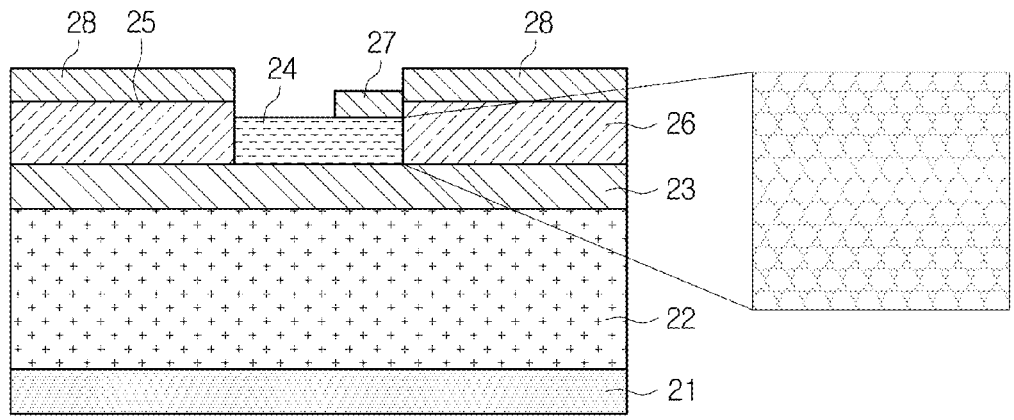

Referring to FIG. 3d, subsequently, the passivation layer 27 may be formed on the graphene layer 24, and the passivation layer 28 may be formed on the source electrode 25 and the drain electrode 26. The passivation layer 27 and the passivation layer 28 may be a designation of a layer formed from one material in the same process, merely distinguished by its location. For example, the passivation layer 27 and the passivation layer 28 may be formed by forming a photoresist on a top surface of the source electrode 25, the graphene layer 24, and the drain electrode 26, and partially removing the photoresist from the surface of the graphene layer 24. A region where the photoresist is to be removed may be minutely controlled using a micro-patterning technique.

Figure 3E:
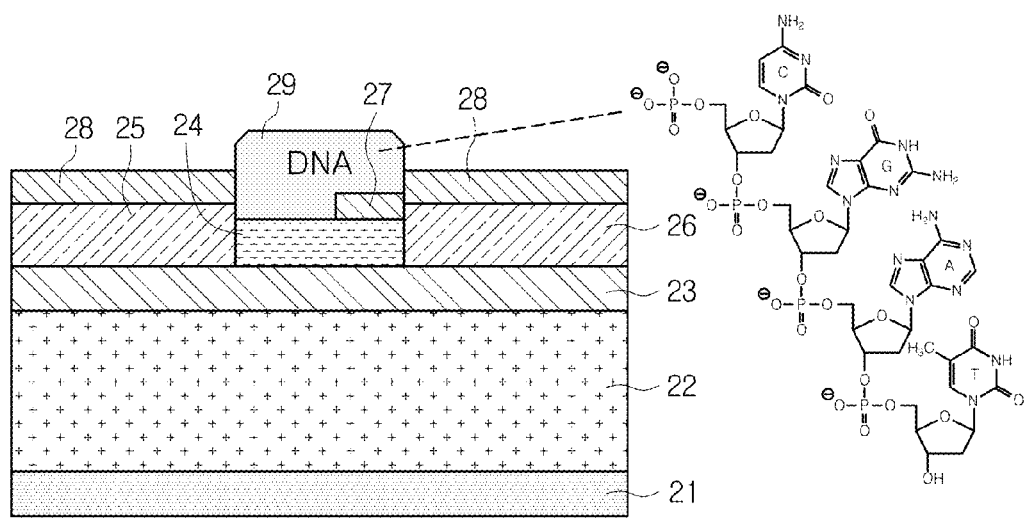

Referring to FIG. 3e, finally, the DNA molecule layer 29 may be formed on the graphene layer 24 such that the DNA molecule layer 29 comes in contact with the exposed graphene layer 24 that is not covered by the passivation layer 27. The DNA molecules constituting the DNA molecule layer 29 have a nucleotide sequence structure designed to provide a predetermined semiconductor property to the graphene layer 24. Graphene has a sp2 orbital structure so that the DNA molecules may easily bind to the surface without an additional pre-treating process.

An exemplary method of forming the DNA molecule layer 29 is as follows. First, a colloid solution of a concentration of about 6 ng/ml is prepared by dispersing DNA molecules in deionized (DI) water. Subsequently, after transferring 3 microliter of the DNA colloid solution to a region including an exposed portion of the graphene layer 24 using a pipette, the graphene layer 24 is put in a beaker containing DI water, and washing is performed for one minute using a stirrer. Through this method, DNA may be coated on a desired region of the graphene layer 24.

However, this is only for illustration purposes, and the method of forming the DNA molecule layer 29 may include any method known or to be developed later whereby DNA molecules may be adsorbed on a desired region of the graphene layer 24, without limiting to a particular method.

Figure 4A:
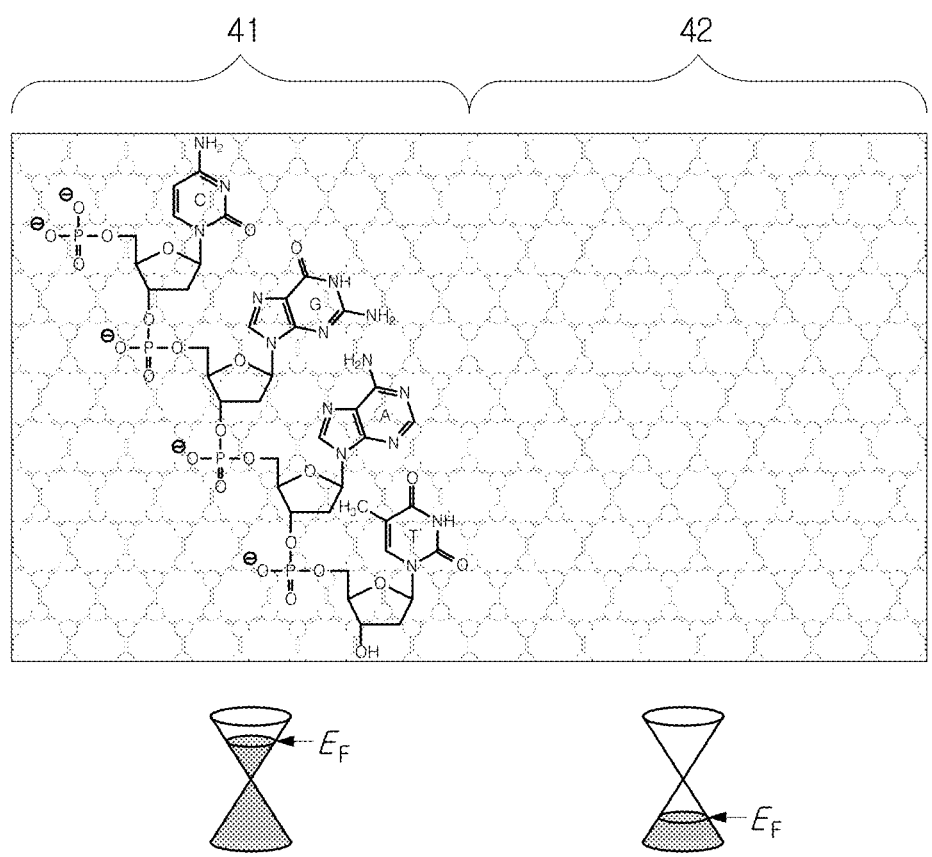
FIGS. 4a through 4c are conceptual diagrams, respectively, illustrating formation of a PN junction, an NPN junction, and a PNP junction according to embodiments.
Figure 4B:
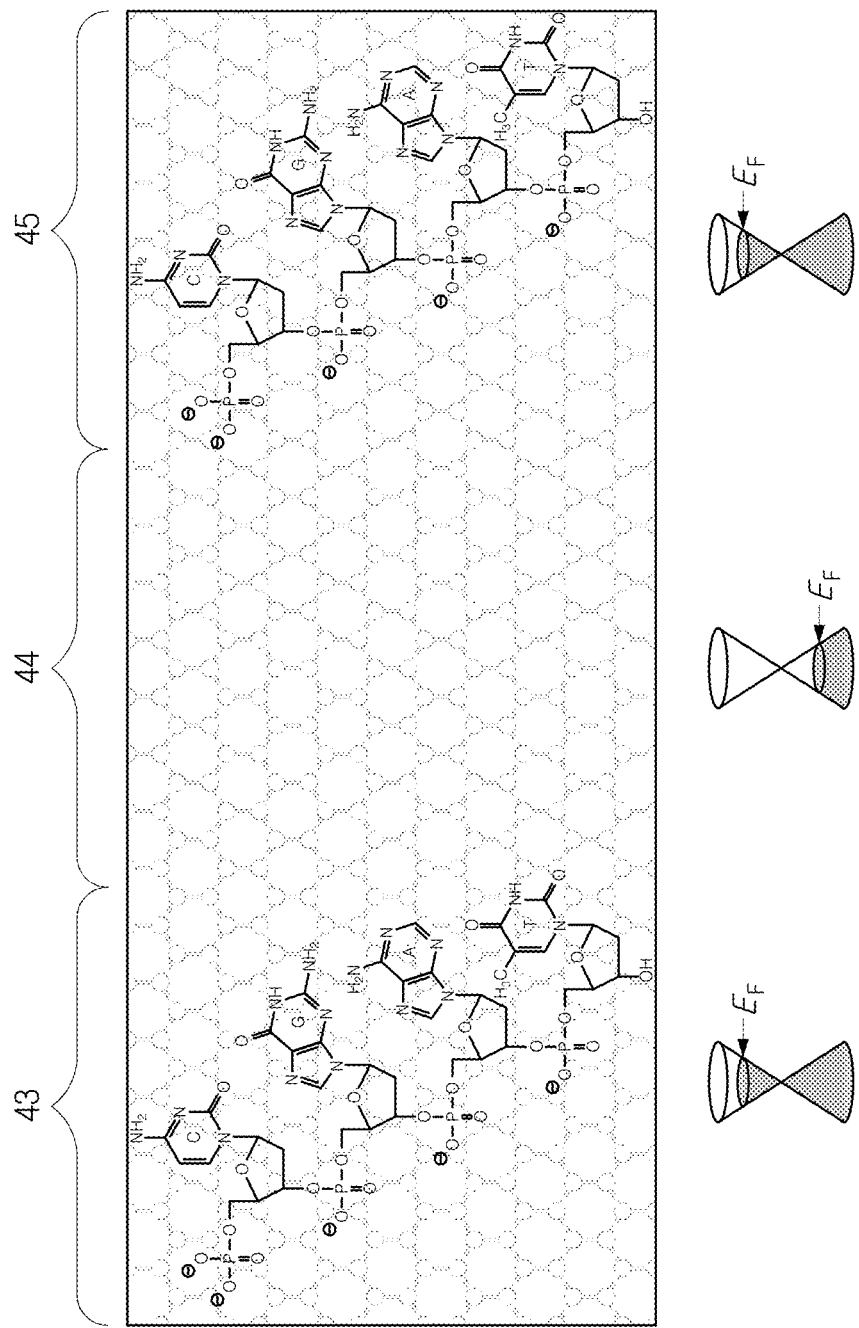
Figure 4C:
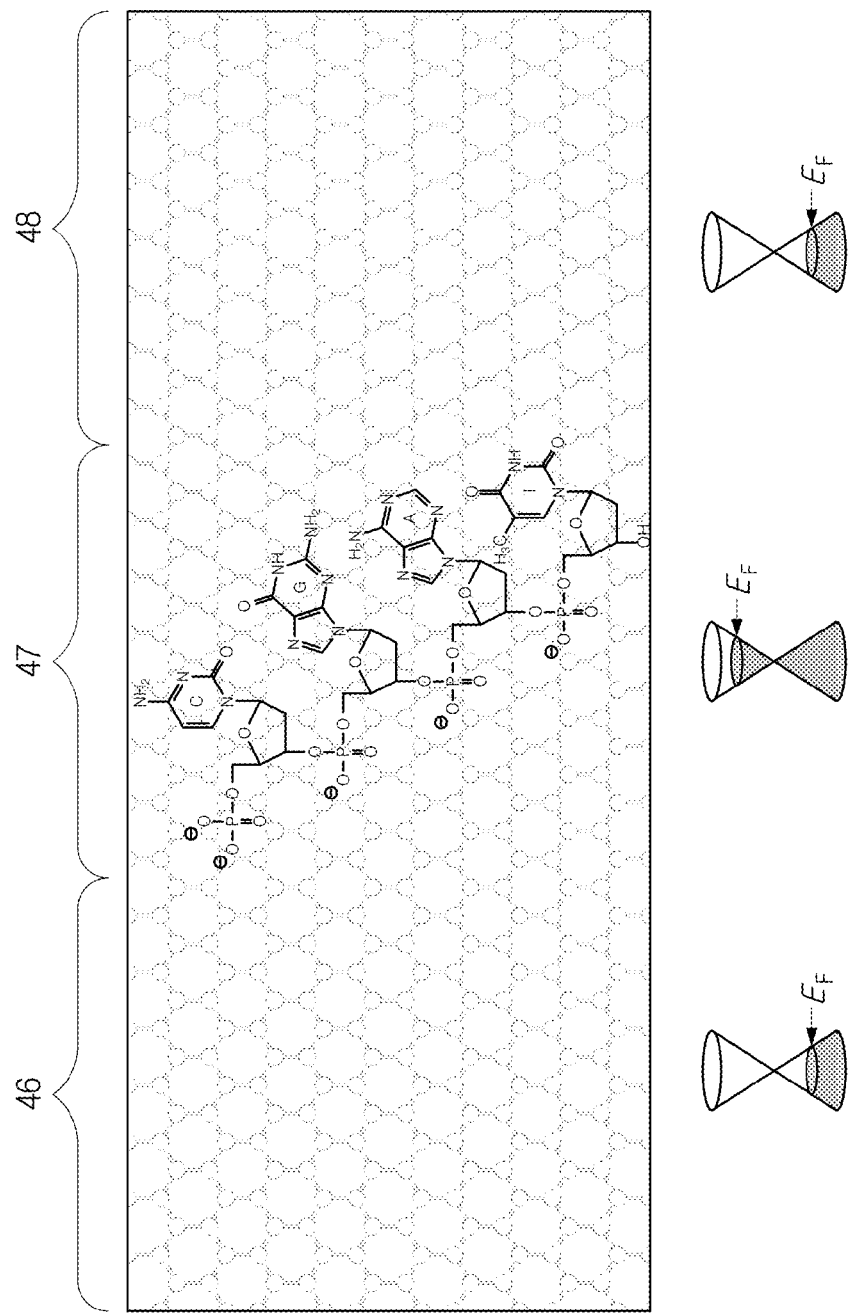

FIGS. 4a through 4c are conceptual diagrams, respectively, illustrating formation of a PN junction, an NPN junction, and a PNP junction according to embodiments.

Referring to FIG. 4a, according to an embodiment, a region 41 where a DNA molecule is adsorbed and a region 42 where a DNA molecule is not adsorbed may be formed in a graphene layer. The region 41 where a DNA molecule is adsorbed has a change in carrier concentration of graphene by electron exchange between graphene and the DNA molecule adsorbed on graphene. As a result, the Fermi level $E_F$ of the region 41 changes so that the region 41 has an n-type semiconductor property. On the contrary, the region 42 where a DNA molecule is not adsorbed has a p-type semiconductor property inherent to graphene. Accordingly, a PN junction is formed by the two regions 41 and 42.

In FIG. 4a, a size or a binding structure of carbon atoms constituting the graphene layer and the DNA molecule located thereon is for the purpose of conceptually illustrating that the DNA molecule is adsorbed on a corresponding region of the graphene layer, and It should be understood that the illustrated DNA molecule is not intended to define a boundary of a region where a DNA molecule will be actually adsorbed or limit a size or type of a DNA molecule. This is equally applied to FIGS. 4b and 4c to be described below.

Referring to FIG. 4b, according to an embodiment, a region 43 where a DNA molecule is adsorbed, a region 44 where a DNA molecule is not adsorbed, and another region 45 where a DNA molecule is adsorbed may be arranged in a graphene layer in a sequential order. As a result, a bipolar transistor of an NPN junction structure may be formed by the three regions 43, 44, and 45.

Also, referring to FIG. 4c, according to an embodiment, a region 46 where a DNA molecule is not adsorbed, a region 47 where a DNA molecule is adsorbed, and another region 48 where a DNA molecule is not adsorbed may be arranged in a graphene layer in a sequential order. As a result, a bipolar transistor of a PNP junction structure may be formed by the three regions 46, 47, and 48.

As described hereinabove with reference to FIGS. 4a through 4c, according to the embodiments, PN junction devices having various structures may be implemented based on whether a DNA molecule is coated on each region of a graphene layer. Also, although the specification discloses embodiments in which an n-type semiconductor property is provided to a graphene layer by adsorption of a DNA molecule, a semiconductor property being provided to a graphene layer by the DNA molecule may be determined differently based on a type and an arrangement of coated DNA bases.

According to the embodiments described hereinabove, a chemical doping effect may be provided to graphene using a DNA coating technique and an electrical property change of a DNA molecule based on a nucleotide sequence structure. Through this, a PN junction may be formed on a graphene surface. According to the embodiments, the problems of high process costs and damage to an atomic arrangement structure of graphene during a process involved in graphene doping by a conventional chemical method may be solved, and a period of time and process costs required for a doping process may be reduced. Also, because a DNA molecule-graphene bond is formed through a simple adsorption process, the number of process steps is decreased and the process becomes less difficult, and thus, a device manufacturing yield may increase. Further, nucleotide sequence structure design of DNA can be easily enabled using a commercial technology, and through this, a doping property of graphene may be minutely controlled.

A method for forming a PN junction in graphene and a PN junction structure according to the embodiments may be advantageously used in various graphene-based active devices such as a flexible display, a flexible solar cell, a transparent display, a graphene-based ultra high speed transistor, and the like.

It will be understood by those skilled in the art that many modifications and changes may be made thereto without departing from the spirit and scope of the present disclosure, and the present disclosure is not limited to the disclosed embodiments and the accompanying drawings.

What is claimed is:

1. A method for forming a PN junction in graphene, the method comprising:
forming by lithography a graphene layer pattern having a first partial region and a second partial region; and
adsorbing a DNA molecule layer on the second partial region of the graphene layer, the DNA molecule layer having a nucleotide sequence structure designed to provide the second partial region with a predetermined doping property upon adsorption,
wherein the first partial region, on which the DNA molecule layer is not adsorbed, has a doping property different from the predetermined doping property.

2. The method for forming the PN junction in graphene according to claim 1, further comprising:
controlling a base ratio of the nucleotide sequence structure in the DNA molecule so as to achieve the predetermined doping property.

3. The method for forming the PN junction in graphene according to claim 2, wherein the controlling of the base ratio in the DNA molecule comprises controlling a ratio of cytosine and guanine in the DNA molecule.

4. The method for forming the PN junction in graphene according to claim 1, further comprising:
forming a passivation layer on the graphene layer;
patterning the passivation layer such that the passivation layer is selectively removed from the second partial region of the graphene layer; and
adsorbing a DNA molecule on the graphene layer and the patterned passivation layer to obtain the predetermined doping property in the second partial region and to obtain the doping property different from the predetermined doping property in the first partial region.

5. The method for forming the PN junction in graphene according to claim 1, further comprising:
before adsorbing the DNA molecule layer on the graphene layer, forming a source electrode and a drain electrode in contact with the graphene layer at both sides of the graphene layer, the source electrode and the drain electrode being spaced apart from each other.

6. The method for forming the PN junction in graphene according to claim 1, wherein the first partial region is disposed between the second partial region and a third partial region with the predetermined doping property.

7. The method for forming the PN junction in graphene according to claim 1, wherein the second partial region is disposed between the first partial region and a third partial region with a doping property different from the predetermined doping property.

8. The method for forming the PN junction in graphene according to claim 1, wherein the second partial region where the DNA molecule layer is located among the graphene layer has an n-type semiconductor property.

9. A method for forming a PN junction in graphene, the method comprising:
forming a graphene layer having a first partial region and a second partial region; and
adsorbing a DNA molecule layer on the second partial region of the graphene layer, the DNA molecule layer having a nucleotide sequence structure designed to provide the second partial region with a predetermined Fermi level ($E_F$) upon adsorption,
wherein the first partial region, on which the DNA molecule layer is not adsorbed, has a Fermi level ($E_F$) different from that of the second partial region, thereby forming a PN junction between the first partial region and the second partial region.

10. The method for forming the PN junction in graphene according to claim 9, wherein the first partial region is disposed between the second partial region and a third partial region with a Fermi level ($E_F$) the same as that of the second partial region.

11. The method for forming the PN junction in graphene according to claim 9, wherein the second partial region is disposed between the first partial region and a third partial region with a Fermi level ($E_F$) different from that of the second partial region.

12. The method for forming the PN junction in graphene according to claim 9, wherein the second partial region has an n-type semiconductor property where the DNA molecule layer is adsorbed thereon.

13. The method for forming the PN junction in graphene according to claim 1, wherein the first partial region, on which the DNA molecule layer is not adsorbed, has a doping property opposite to the predetermined doping property.

* * * * *